(12) United States Patent
Baldwin

(10) Patent No.: US 6,583,603 B1
(45) Date of Patent: Jun. 24, 2003

(54) BACK-UP BATTERY MANAGEMENT APPARATUS AND METHOD FOR CHARGING AND TESTING BATTERY CELLS IN A STRING OF BATTERY CELLS

(75) Inventor: Norman C. Baldwin, Thornville, OH (US)

(73) Assignee: Peco II, Inc., Galion, OH (US)

( * ) Notice: Subject to any disclaimer, the term of this patent is extended or adjusted under 35 U.S.C. 154(b) by 0 days.

(21) Appl. No.: 10/071,052

(22) Filed: Feb. 8, 2002

(51) Int. Cl.$^7$ .................................................. H02J 7/00
(52) U.S. Cl. ........................................................ 320/121
(58) Field of Search ................................. 320/116, 118, 320/121, 122, 134, 136; 324/426, 427, 429, 430, 434; 307/19, 46, 47, 65, 66

(56) References Cited

U.S. PATENT DOCUMENTS

| | | | |
|---|---|---|---|
| 4,044,300 A | 8/1977 | Dupuis et al. ............... 324/434 |
| 4,488,057 A | 12/1984 | Clarke ........................... 307/66 |
| 5,047,961 A | 9/1991 | Simonsen ..................... 702/63 |
| 5,126,585 A | 6/1992 | Boys .............................. 307/66 |
| 5,160,851 A | 11/1992 | McAndrews ................. 307/66 |
| 5,250,904 A | 10/1993 | Salander et al. ............. 324/430 |
| 5,416,416 A | 5/1995 | Bisher ........................... 324/426 |
| 5,432,429 A | 7/1995 | Armstrong, II et al. ..... 320/136 |
| 5,583,440 A | 12/1996 | Bisher ........................... 324/426 |
| 5,646,509 A | 7/1997 | Berglund et al. ............ 713/321 |
| 5,710,503 A | 1/1998 | Sideris et al. ................. 324/431 |
| 5,726,573 A | 3/1998 | Chen et al. ................... 324/429 |
| 5,777,454 A * | 7/1998 | McAndrews et al. ......... 307/66 |
| 5,886,503 A | 3/1999 | McAndrews ................. 320/121 |
| 5,923,148 A | 7/1999 | Sideris et al. ................. 320/116 |
| 5,929,538 A | 7/1999 | O'Sullivan et al. ............ 307/66 |
| 5,955,869 A | 9/1999 | Rathmann ..................... 320/132 |
| 5,969,625 A | 10/1999 | Russo ........................... 340/636 |
| 5,990,575 A | 11/1999 | Flaugher ....................... 307/23 |
| 6,031,354 A | 2/2000 | Wiley et al. .................. 320/116 |
| 6,040,640 A | 3/2000 | Gehre et al. .................... 307/66 |
| 6,043,629 A | 3/2000 | Ashley et al. ................ 320/119 |
| 6,084,382 A | 7/2000 | Hite .............................. 320/116 |
| 6,133,709 A | 10/2000 | Puchianu ...................... 320/116 |
| 6,137,266 A | 10/2000 | Chalasani et al. ............ 320/133 |

* cited by examiner

Primary Examiner—Edward H. Tso
Assistant Examiner—Pia Tibbits
(74) Attorney, Agent, or Firm—Marshall, Gerstein & Borun

(57) ABSTRACT

An apparatus and method for controllably charging and discharging individual battery cells or groups of battery cells in a string of batteries employed as a back-up power supply is provided. The apparatus includes battery supply modules for at least partially isolating battery strings from the load bus and primary power supply. The partial isolation is effected by a switching network including two controlled switches arranged in parallel to selectively isolate the string of batteries. In certain disclosed embodiments, one of the controlled switches is turned on to connect the string of batteries to the load bus until the other controlled switch closes. The system includes a main power supply that supplies a power bus to a regulator in each battery supply module, which is used for charging the battery string, and a discharge bus to each battery supply module for discharging the batteries.

53 Claims, 2 Drawing Sheets

BACK-UP BATTERY MANAGEMENT APPARATUS AND METHOD FOR CHARGING AND TESTING BATTERY CELLS IN A STRING OF BATTERY CELLS

BACKGROUND

In telephone switching equipment, communication equipment, computer equipment, and in many other applications, the need for an uninterrupted source of DC power is critical. Rectified commercial AC power is typically used as the primary source of DC power for such equipment.

To avoid any interruption or outage in power service, it is common practice to employ a battery back-up for the primary DC source. Back-up battery systems typically include strings of batteries or cells connected in parallel with the primary DC source and the load. In the event of a drop in the load bus voltage below a predetermined threshold, the back-up battery supplants or supplements the primary source of DC power. Back-up battery systems are designed to replace the primary DC power source for a predetermined period of time within which resumption of primary power is expected to occur.

In conventional back-up battery systems, the nominal system load bus voltage has typically been dictated by battery characteristics. For example, in a telephone switching plant, back-up batteries commonly employed have a design cell voltage of 2.26 volts and are connected to provide negative voltage to a load. Twenty-four of these cells are typically combined in a string, resulting in a nominal load bus voltage of approximately −54 volts. A bank of strings supplies the necessary back-up DC power.

As the back-up batteries are placed across the load, the full −54 volts of system DC voltage are placed across the battery string. This design architecture of a typical back-up battery system presents a number of potential problems. Certain batteries, due to their electrochemical constitution, will draw more current than other batteries. All batteries, as they age, will experience increasing internal resistance and will draw more charging current from the main DC supply.

In recent years, a newer type of lead acid battery was introduced into the marketplace. The battery is sealed, and purportedly requires no maintenance. In this type of battery, oxygen and hydrogen produced during electrochemical reactions in the battery recombine to maintain an aqueous liquid electrolyte at a constant level within the cell. As a result, these batteries have only a small amount of liquid electrolyte. These batteries have become known as "valve regulated", or "recombinant" or "electrolyte-starved" batteries. This type of lead acid battery (hereinafter termed "valve regulated lead acid" or "VRLA" batteries) has often failed well before their design life, which is typically 10 years.

It has been observed that a battery, over time, may begin to take on greater current to maintain its charge. This increasing charging current will elevate the temperature of the battery. The chemical recombination of the oxygen and hydrogen gases also creates heat. As the internal battery temperature increases, the current demand increases disproportionately. For every 10 degrees Celsius of increase in the battery's internal temperature, the current demand doubles. A battery in this condition will have one of two failure modes, the most damaging being "thermal runaway." Thermal runaway may lead to an explosion of the battery, with likely destruction or severe damage to any nearby equipment. Alternatively, the battery may experience a "melt down" and produce noxious gases which are also apt to damage or destroy neighboring equipment. Moreover, the rectified AC source provided in typical telephone switching plants has more than ample capacity to supply any one or more batteries demanding abnormal charging current, thus encouraging thermal runaway or meltdown failures.

With the advent of fiber optic signal distribution, communications switching equipment has been decentralized, introducing a need for DC power supplies in unattended satellite installations distributed throughout the territory served. In these unattended installations, the equipment is often closely packed, leading to hostile thermal operating conditions for the equipment and increased occurrences of thermally induced failures. In less severe conditions, the placement of the back-up batteries directly across the load is apt to result in dry-out (loss of electrolyte), positive grid corrosion, and other problems which may lead to premature battery failure and/or sub-normal power performance.

Back-up battery systems must be monitored to determine the health and capacity of the batteries. The need to perform battery tests is particularly troublesome in systems that require the supply of an uninterrupted source of DC power. Testing of the vital statistics of a battery affecting output capacity, predicted life, etc. is presently done by taking the battery strings off-line and testing them in one of two ways. The test procedure recommended by battery manufacturers as being the most reliable is to discharge the battery into a load while measuring the response of the battery. The ability of a battery or battery string to hold a predetermined current level for a predetermined time is a reliable measure of the health and capacity of the battery. However, such discharge tests in the field require experienced personnel and are difficult and costly. Further, conventional battery testing, requiring the batteries to be taken off-line, suffers a loss of standby battery protection for the telephone plant or other equipment being supplied while the tested batteries are off-line.

To avoid the cost and inconvenience of a discharge test, special field test equipment is commonly employed that tests for battery resistance, impedance, inductance, and other parameters and characteristics without discharging the battery. See U.S. Pat. No. 5,250,904. However, as noted, tests that do not involve discharging the battery are apt to be less reliable.

U.S. Pat. No. 5,160,851 discloses a back-up battery system for telephone central office switching equipment. The back-up battery system includes one or more rechargeable batteries having cells floated at a given float voltage. The cells are of a number such that when the batteries are switched in circuit across the load, the cumulative voltage of the batteries exceeds a predetermined load voltage for a preselected period. The over-voltage that results from the switching in of extra cells across the load is down converted by a converter. The converter, a sensor for sensing the system discharge bus voltage, and a switch may be formed as a single unit using MOSFET technology. It is said that in such case a fail-safe contact switch might also be provided to parallel the MOSFET switch and be operated in the event of its failure.

U.S. Pat. No. 5,886,503, incorporated herein by reference, discloses an apparatus that selectively tests battery cells in a string of battery cells employed as a back-up power supply to a primary power source. The apparatus includes an isolation circuit for partially isolating the string of battery cells from the load bus while permitting current flow between the battery cells and the load bus in the event of a failure of the primary power supply. A switching network is also disclosed wherein at least two controlled switches are arranged to selectively form circuits for discharging one or more of the battery cells while the cells remain connected in the string. A logic circuit connected to the controlled switches determines and selects which of the battery cells will be discharged for testing.

DETAILED DESCRIPTION OF THE PREFERRED EMBODIMENTS

Figure 1:
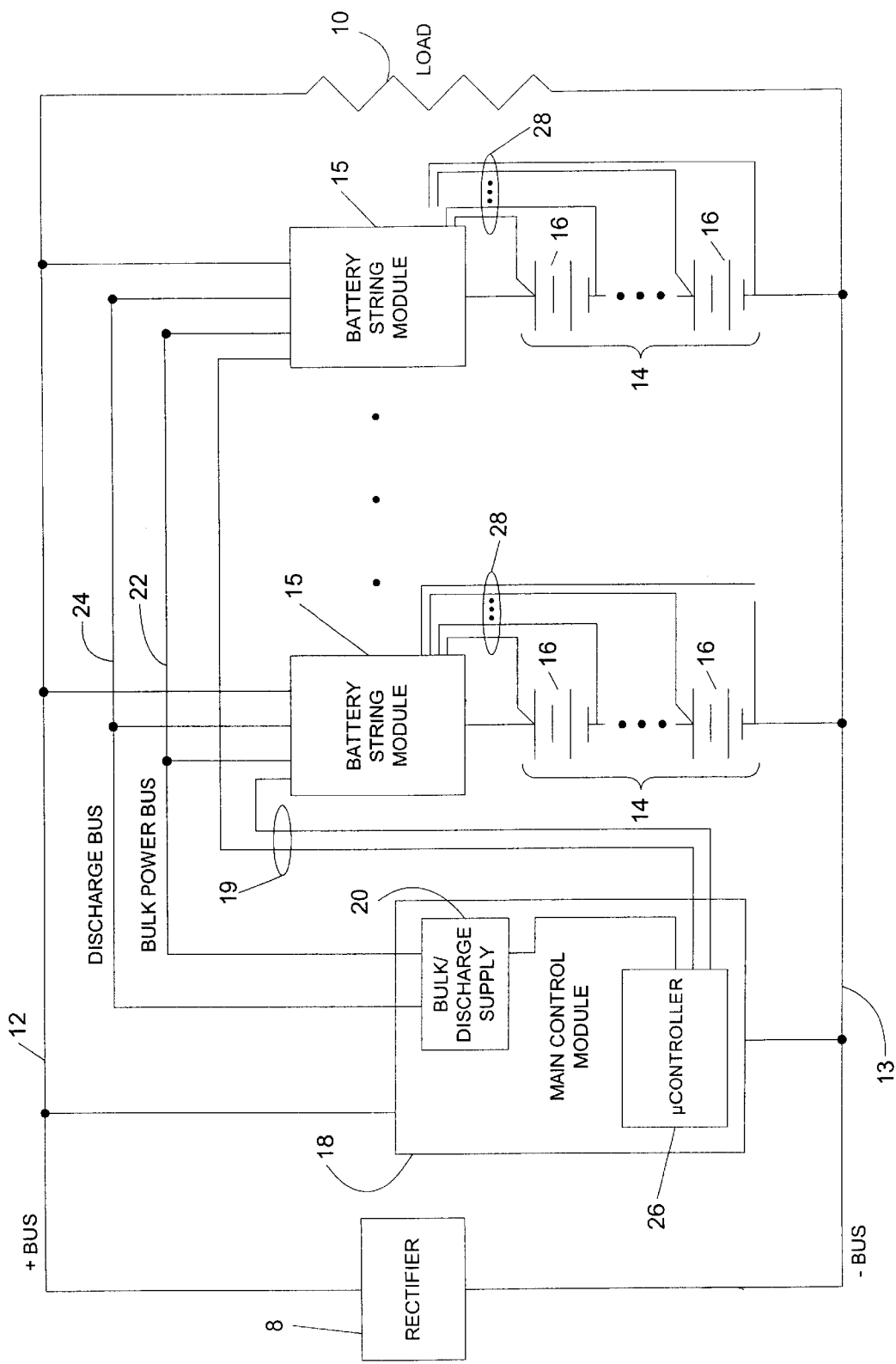
FIG. 1 is a schematic block diagram of a back-up battery management apparatus shown in an environment of use.

A system supplying DC power from a primary DC source 8 to a system load 10 employing a battery back-up is illustrated in FIG. 1. The DC power from the primary source 8 is transmitted to the load 10 through a system load bus having a positive bus designated portion 12 (i.e., +BUS) and a negative bus designated portion 13 (i.e., −BUS) respectively connected between the DC power source 8 and the load 10. The primary DC source 8 may comprise a full-wave rectifier, as indicated in FIG. 1, to derive DC power from a source of AC power.

A system for use in a telephone switching office, in particular, may employ a bank of battery strings to store energy required for the battery back-up. In the system illustrated in FIG. 1, two exemplary strings of batteries 14 are shown schematically in parallel across the load 10, the electrical connection of the battery strings 14 being controlled by a respective battery string module 15. In a typical installation, each battery string 14 comprises a number of cells or groups of cells 16. As noted, each cell may produce, for example, −2.26 volts. In a series connected bank of 24 cells (e.g., 4 cell groups each having 6 cells), a total of approximately −54 volts DC is developed.

The system of FIG. 1 further includes a main control module 18 that directs central control of and supplies power to the battery string modules 15. Power supply for the main control module 18 may be derived by connecting to the positive and negative bus portions of the system bus 12, 13, as shown. Various control signals, monitoring functions and communications may be achieved via control lines 19 from the main control module 18 to the respective battery string modules 15. The main control module 18 includes a bulk/discharge power supply 20 that is used to supply two additional busses. One of the busses is a bulk power bus 22 that supplies the power used by the battery string modules 15 for battery charging. The other bus supplied by the bulk/discharge power supply 20 is a discharge bus that is used by the battery string modules to discharge the batteries within the battery strings 14 during testing of the batteries.

The main control module 18 also includes a microprocessor or microcontroller 26 that controls the operation of the bulk/discharge power supply 20, as will be discussed later. Also, the microcontroller 26 may be used to monitor conditions of the overall system, such as battery string module failures, or to effect external communication, such as through a modem, IP network, or any other known communication protocol.

Also shown in FIG. 1 are a plurality of monitoring lines 28 located between the battery string modules 15 and their respective battery strings 14. These monitoring lines 28 afford monitoring by the battery string modules 15 of battery conditions such as the voltages across particular cell groups 16. Additionally temperature monitors (not shown) may be employed and connected to respective monitoring lines in order to monitor battery cell temperatures, especially during boost charging and discharging.

As will be explained in the following text, the battery management system of FIG. 1 makes possible controlled charging of the battery strings at a rate that is constant at a given time and for a given condition of the battery cells to avoid the potential for thermal runaway and the other performance and reliability degrading problems. Further, these benefits are achieved without depriving the battery strings of their capability of supplying emergency DC power to the load in the event of an outage or drop in the primary DC source output voltage.

Figure 2:
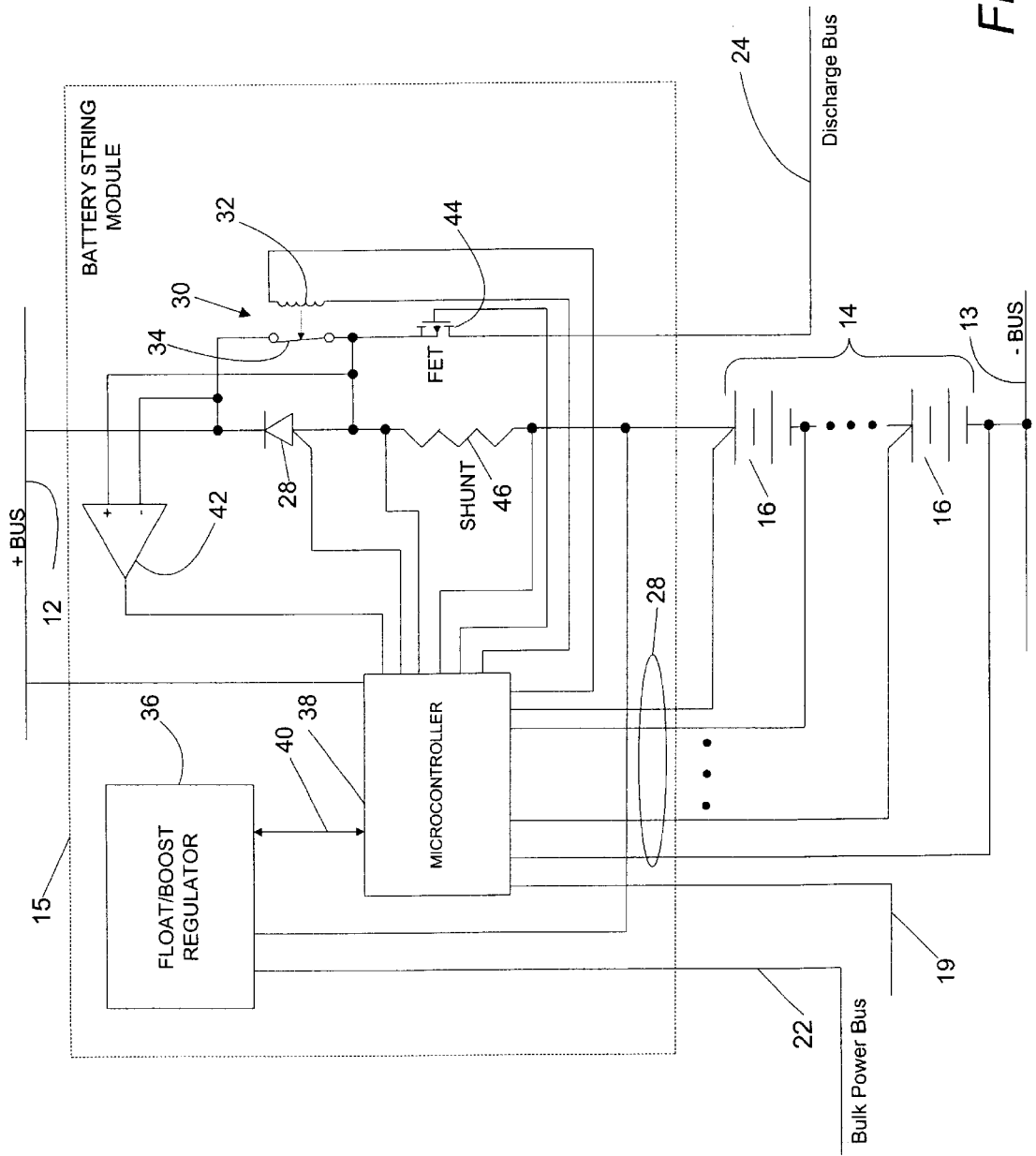
FIG. 2 is a schematic diagram of a battery string module as shown in FIG. 1.

FIG. 2 illustrates a detailed schematic of an exemplary battery string module 15 and accompanying elements that are used within the system of FIG. 1. A feature of the battery string module 15 is the use of a variable isolation impedance connected in series with the battery strings 14. (As used herein, the terms "battery" and "battery string" are used interchangeably to mean any series of battery cells, irrespective of their particular construction.) Any of a number of circuit structures and components may be employed to implement the variable isolation impedance device, which preferably has a high reverse impedance and a variable forward impedance. In the embodiment illustrated in FIG. 2, a gated silicon device is employed and shown here as an SCR (silicon controlled rectifier) 28, but may be comprised of any known variable impedance device that is controllable.

The function of the isolation impedance (e.g., SCR 28) is to electrically isolate the battery strings 14 from the load bus 12, 13. Isolating the battery strings 14 from the system load bus 12, 13 yields a variety of benefits that will become evident from the ensuing description, but includes allowing proper maintenance of the battery strings 14. As will be explained, under normal operating conditions the SCR 28 is turned "OFF" (i.e., no gate current is supplied to the SCR from a microcontroller 38). Only when predetermined conditions occur, will the microcontroller 38 supply a constant gate current to the gate of the SCR 28 (termed "hard gating") for a predetermined time period. Placement of the battery strings 14 across the load 10, which places them subject to the primary DC source 8, sets up conditions for thermal runaway, accelerated positive grid corrosion and electrolyte dry-out in VRLA batteries, for example, and establishes conditions for performance and reliability degradation in batteries of other types.

A shunting contactor set 30 preferably comprised of a normally closed relay having a relay coil 32 that actuates a set of switch contacts 34 is connected in parallel with the SCR 28 and connects the battery strings 14 to the system load bus 12, 13 under certain conditions, as will be explained later. The shunting contactor set 30 having normally closed contacts will fail "safe", thus connecting the battery strings 14 to the system load bus 12, 13 in the event that the contactor set 30 or its control fails.

A float/boost regulator 36 is electrically connected in series with the battery string 14 to enable provision of a constant maintenance or "float" current to float charge the battery strings 14, when called for. The float/boost regulator 36 is a post regulator that regulates power converted by the bulk/discharge supply 20 and delivered via the bulk power bus 22. The regulator 36 may be of conventional construction, with the addition of control circuitry, or a specific construction. Regardless of the construction, however, the float/boost regulator 36 makes possible the application of a constant voltage across the battery cells and control of battery current, as will be described hereinafter.

The float/boost regulators 36 of each battery string module 15, as mentioned previously, receive power from the bulk/discharge supply 20 via the bulk power bus 22. Preferably, the voltage output of the bulk/discharge supply 20 is monitored and controlled by microcontroller 26 such that the amount of heat that may be potentially generated by the float/boost regulators 36 in the battery string modules 15 is limited by limiting the voltage of the bulk power bus 22 to a prescribed value that provides just enough "head room" (i.e., a range of voltage above normal operating voltage) for the float/boost regulators 36 to operate. Such control by utilization of a single power supply (e.g., bulk/discharge power supply 20) affords reduced cost and size of the overall system as well as providing increased safety by engendering the capability to prevent the voltage of the bulk power bus 22 to rise excessively high should the load 10 decrease to a point that it no longer provides a current sink for the battery strings 14 when discharging. Moreover, a single switching power supply (i.e., bulk/discharge supply 20) reduces the electrical noise (e.g., electromagnetic interference (EMI) and radio frequency interference (RFI)) in the system overall over previous backup systems employing multiple switched power supplies.

The microprocessor or microcontroller 38 also provides control of the float/boost regulator 36 within the battery string module 15 via control connection 40 when the battery strings 14 are being float charged (i.e., maintenance of the battery charge) and boost charged (i.e., returning discharged batteries to a charged state). Optimal maintenance of the battery strings 14 is accomplished by controlling the voltage level at which the batteries are to be charged and to limit the amount of current that can be delivered to the battery strings 14 while they are charging. The level of float current is dependent upon the type, size, and age of the battery.

In addition to controlling the regulator 36, the microcontroller 38 also performs monitoring and controlling functions in the battery string module 15 of FIG. 2. Characteristics monitored by the microcontroller 38 include the voltage of each battery string and the battery cell voltage or battery-string ¼ point, midpoint and ¾ point voltages for a string comprised of 4 batteries or cell groups 16, as an example. Further monitored characteristics may include the battery-string current using a monitor shunt 46, and battery internal temperature and resistance (sensors not shown), as well as the system load bus voltage. In addition, a differential amplifier 42 having two inputs respectively located across the SCR 28 is used by the microcontroller 38 to monitor and measure the voltage differential across the SCR 28.

The microcontroller 38 further controls the discharge contactor set 30 by providing current to coil 32, controls the SCR 28 by providing gate current to the SCR gate, as mentioned previously, and controls discharge testing through a controllable switch such as FET 44, which selectively establishes an electrical connection of the battery string 14 to the discharge bus 24. Of further note, when being used for discharge testing, the output of the bulk/discharge supply 20 is limited by the microcontroller 26 such that the voltage of the discharge bus 24 combined with battery string voltage will not raise the voltage of the bus 12, 13 beyond a prescribed range, such as a few hundred millivolts, for example, especially in the case where the load on the bus draws less current than the test discharge current limit desired to test the batteries 16.

In operation, the battery management system of FIG. 1 provides a means to control the factors that influence the life of a VRLA battery or batteries of other types. The control and management of the way a battery is charged, with particular attention to the float, boost and temperature compensation methods of charging batteries, will help maximize their useful life. Further, the battery management system shown in FIGS. 1 and 2 provides means to test a string or strings of batteries while monitoring cell voltages, thus obtaining accurate information with regard to their extant capacity. Also, the present battery management system is designed so that any failure mode affecting the ability of the system load bus 12, 13 to sustain the system load 10 will immediately place the power system in a battery connected to the load configuration.

During normal operation the primary DC source 8 supplies all load current via the system load bus 12, 13 to the system load 10. The VRLA battery strings 14 are connected to the system load bus 12, 13, but their voltage is displaced/blocked by the impedance of the ungated SCR 28.

During float charge operation, which is the predominate mode of operation for the back-up battery strings 14, the bulk/discharge supply 20 provides power to each of the float/boost regulators 36 in each battery string module 15, as mentioned previously. The float/boost regulators 36, in turn, provide a predetermined substantially constant maintenance or float current to float charge the battery strings 14. The amount of the current is dependent upon the type, size, and age of the battery, as noted previously. Also, as noted, the float charging current is substantially constant at a given time and for a given condition of the battery cells, but may differ at different times and battery conditions.

While maintaining the battery strings 14 with a float charge, on a command signal from the microcontroller 38, the float/boost regulator 36 increases its constant current output to a higher boost charging amount. Like the float charging current, a boost charging current ($I_{Boost}$) is constant at a given time and for a given condition of the battery cells, but may differ at different times and battery conditions, and will differ depending upon size of the battery. In practice, the substantially constant charging current, whether float or boost, delivered to the battery strings is determined by individually testing, at the direction and under the control of the microcontroller 38, of the battery cells. The microcontroller 38 determines for a given application of charging current, or a given period of time, an optimum level of current that will cause the battery cells to deliver optimum performance over a maximum predicted life. The testing of the battery cells may include impressing on the individual cells a battery manufacturer specified fixed voltage to determine the current demand of the individual cells. The float/boost regulator 36 limits the current supplied to the individual cells during this test.

During boost charge the increased current begins to overcharge the battery strings 14. This overcharging causes the battery string's voltage to increase.

The frequency of occurrence of the command signal from the controller 26 that initiates the boost charge is determined by battery measurements taken periodically (every 24 hours, for example) while on float charge. The end of the boost charge occurs when the voltage of the battery strings 14, monitored by the controller 26, reaches a peak and levels off. During this period, battery cell voltages (or battery string midpoints as a minimum) are monitored by the battery management system controller 26 to ensure that the cells 16 are properly accepting the higher charge current.

The boost charge, which occurs when needed (as determined by battery parameter measurements), ensures that both the positive and negative electrodes of the battery string cells 16 are polarized. Boost charging ensures that the cells 16 are fully charged and can recombine the gases involved. This will minimize cell "dry out" (water loss), and add to the useful life of the VRLA and other types of battery cells.

Whenever the primary DC source 8 is unable to supply the total load current, the system load bus voltage begins to decay. Typically the decay of the system load bus voltage to a level 1 to 2 volts below the desired level occurs over several hundred milliseconds due to inherent capacitance within the system. Such delay provides ample time for the microcontrollers 38 to detect that the system load bus voltage is falling before the voltage drop approaches one to two volts. Thus, when the microcontroller 38 detects the decay of the load bus voltage, a hard gate signal is sent from the microcontroller 38 to the gate of SCR 28. If the difference between the load bus voltage and the battery string voltage is greater than the forward voltage drop of the SCR 28, which is approximately 1.5 volts (although SCR's are known to start conducting with a voltage difference as low as 0.8 volts), the SCR 28 will begin to conduct within a few milliseconds, effectively placing the batteries onto the system load bus 12 almost immediately. This ensures that transition to battery power onto the system load bus is smooth and does not cause interruption of power to the load 10. Simultaneously, the microcontroller 38 initiates operation of the contactor set 30 by de-energizing the coil 32 of the contactor set 30, thereby causing the normally closed switch contacts 34 to begin to close. Because the time required to close the contacts 34 (e.g., approximately 200 milliseconds (although this is dependent on the particular contact set chosen)) is slower than the switching time of the SCR 28 (e.g., a few milliseconds), however, the SCR 28 will conduct well prior to the closing of the contacts 34 in order to immediately place the batteries onto the system load bus, as mentioned. After the contacts 34 close and begin conduction, the voltage across the SCR 28 will greatly diminish below the forward conduction voltage of the SCR 28 causing the SCR 28 to cease conducting current (i.e., shorting the SCR 28).

Through use of the differential amplifier 42, the microcontroller may constantly monitor the voltage differential across the SCR 28. When the voltage across the SCR 28 drops below a predetermined voltage threshold, thus signifying conduction of current through the contactor set 30, the microcontroller 38 will also stop delivering a hard gate current to the gate of the SCR 28. The predetermined voltage threshold is set to approximately one-sixth (1/6th) of the forward conduction voltage of the SCR 28. For example, the forward conduction voltage of SCR 28 is approximately between 0.8 volts and 1.5 volts. Thus the predetermined threshold voltage would be between approximately 0.13 volts and 0.25 volts. A voltage threshold set as such corresponds to the voltage drop due to internal resistance within the contacts 34. Thus, the gate current to the SCR 28 may be halted as quickly as possible after the contactor set 30 has closed and is carrying current from the battery strings 14 to the load 10. Allowing the SCR 28 to be switched on for only the time period in which the contactor set 30 closes and begins conducting current affords a minimal time period of SCR operation. This allows the SCR 28 to be designed such that it is required to only carry the discharge current delivered by the battery strings 14 for the amount of time that it takes for the contactor set 30 to close. Accordingly, this affords the use of a smaller SCR in the circuit of FIG. 2 as well as reducing or eliminating the need for additional heatsinking for the SCR 28, thereby saving cost. Additionally, the reduction in conduction time of the SCR carrying the discharge current and the accompanying reduction in heating increases the lifetime of the circuit as compared to previous battery back-up systems such as that described in U.S. Pat. No. 5,886,503 where the SCR is constantly hard gated "ON".

The circuit operation described also affords monitoring of only one current (i.e., the float current) rather than simultaneously monitoring two or more currents. Monitoring only one current at a given time allows analog multiplexers in the microcontroller 38 (not shown) to be utilized for monitoring all currents in the system. In previous systems, the float currents and discharge currents of a battery string were required to be simultaneously monitored because the SCR was continuously hard gated "ON", thus conduction could occur at any moment when the bus voltage began to decay or any other time when the forward voltage drop of the SCR was exceeded.

Throughout all battery discharges, including emergency discharges and test discharges (to be described), the microcontroller 38 constantly monitors the battery string voltage (s) to determine the remaining reserve capacity. Individual cell voltages or battery string voltages (or battery string midpoint voltages as a minimum) are also monitored and the data is stored for later use in determining the health and reserve capacity of the battery strings 14.

After the primary DC source 8 returns to operation, it again supplies all load current via the system load bus 12, 13 to the system load 10. Contactor set 30 remains released (closed), allowing the primary DC source constant voltage output to charge the battery strings 14. Contactor set 30 does not operate (open) until the battery string charge current, as detected by the microcontroller 38, falls below a predetermined level. At that time the signal to the relay coil 32 is resumed causing contactor set 30 to operate (i.e., open the switch contacts 34), and the battery strings 14 receive the remaining boost charge from float/boost regulator 36. Once properly charged, the battery strings 14 return to the float charge mode.

The end of recharging the battery strings 14 from the bus 12, 13 is determined by monitoring the recharge current within the microcontroller via the shunt 46. Additionally, the microcontroller 38 monitors the voltage of the bus 12, 13. Previous systems relied solely on monitoring the recharge current and selecting decrease of the recharge current to the $I_{Boost}$ setpoint value as the determining factor for when the battery strings should be transitioned from charging by the bus 12, 13 to other charging sources. In the present disclosed system of FIG. 2, however, the transition point for switching from charging by the bus 12, 13 to charging by the float/boost regulator 36 is selected to occur when the recharge current decreases to a value less than the $I_{Boost}$ setpoint value. Selecting a predetermined current value setpoint less than the $I_{Boost}$ setpoint preferably should take into account that the efficiency of the float/boost regulator 36 will not be 100 percent, but some value less. Hence, a value of less than 2/3 that of the $I_{Boost}$ setpoint value is utilized in the present system of FIG. 2. Additionally, the system according to the present disclosure monitors the voltage of the bus 12, 13 to ensure that the battery strings 14 have reached a requisite voltage level indicative of a charging level close to the capacity of the battery string 14.

Setting the current value to be significantly less than the $I_{Boost}$ value and also monitoring the bus voltage is based on at least two concerns. In order to more fully understand these two concerns, however, a background discussion of optimal design considerations is first in order. In an optimally designed system, taking into account battery protection, efficiency and economizing, the rectifier 8 is equipped with a current limiting function. Current output by the rectifier 8 is limited to a predetermined maximum value that prevents the battery strings 14 from receiving damaging excess recharge current levels, as well as affording a smaller, more economical sizing of the rectifier 8. This limitation of recharge current occurs, at least in part, because the rectifier 8 is precluded from supplying enough current to both bring the voltage of the bus 12, 13 back to its nominal value (after resumption of power from the rectifier) and to supply large recharge currents to the battery strings 14. Moreover, this design constraint allows minimally sized components, thereby keeping the overall cost of the system at a minimum while still being capable of adequately handling the system power requirements.

Therefore, the first of previously mentioned concerns, in such an economically designed system, is that the voltage of the battery string 14 being charged may still be "low" when the recharge current merely falls below the $I_{Boost}$ setpoint, thus indicating that the battery string has not been charged near its capacity. Hence, a float/boost regulator that would be capable of charging batteries that are not yet charged to near their capacity (e.g., >90%) will be drastically oversized and have serious heat dissipation problems.

The second concern is that in an economically designed system, removing a battery string 14 when the recharge current is just at or immediately below the $I_{Boost}$ level may cause the voltage of the bus 12, 13 to suddenly rise to nominal level due to the rectifier 8 coming out of current limit because the battery string(s) 14 is removed from direct bus recharging. Furthermore, activation of the float/boost regulator 36 at this point in time may cause the rectifier 8 to reenter a current limiting mode due to the increased load (and, thus, current requirements) presented to the system by activation of the float/boost regulator. Since the float/boost regulator 36 is not 100% efficient, more current requirement would now be presented to the rectifier 8 by the float/boost regulator 36, than when the battery strings 14 were being recharged directly from the bus 12, 13. Accordingly, the voltage of the bus 12, 13 would fall and may fall to such a point that the microcontroller(s) 38 will falsely detect a loss of power state requiring that the battery string(s) 14 to supply power to the load 10.

In light of the above concerns, the present system employs both monitoring of the bus voltage as well as setting a current transition point approximately ⅔ of the $I_{Boost}$ value. The selection of these determining factors obviates the above concerns by ensuring transition from bus to float/boost regulator charging only when the battery strings 14 are charged close to their capacity and compensating for the inefficiency of the float/boost regulator 36.

During float charge operation and stable conditions, individual battery string discharge tests can be programmed to occur. Such tests are typically needed only 2 or 3 times per year and the microcontroller 38 can be programmed to perform the tests automatically. These tests can also be performed manually with local input, or manually with remote input. During any mode of testing, the microcontroller 38 provides a signal when the test is to begin.

When the microcontroller 38 determines that it is time for a particular battery string 14 to be subjected to a battery discharge test (each battery string individually), it signals the FET 44 to begin conducting thereby connecting the battery string to the discharge bus 24, while remaining strings are placed on the bus for duration of the test and recharge. This operation transfers the battery string 14 from the float/boost power regulator 36 to the discharge bus 24 supplied by the bulk/discharge supply 20. Additionally, communication is effected between the microcontroller 38 and the microcontroller 26 within the main control module 18. In turn, the microcontroller 26 directs the bulk/discharge supply 20 to provide the discharge bus 24. Specifically, the microcontroller 26 signals the discharge supply 20 to limit the output voltage on the discharge bus 24 to a value such that the bus voltage does not vary excessively should the load on the bus be reduced below a discharge test current limit. Also, the voltage of the discharge bus 24 is set such that when combined with the voltage of the battery string 14, the combined output voltage slightly exceeds the voltage of the system load bus 13, thereby causing discharge current to be provided to the load 10. Preferably, discharge bus 24 regulates the combined output voltage to maintain a battery test discharge current equal to the battery's rated 8 hour discharge rate (dependent upon the size of the battery), for example. Throughout this test the voltage of the load bus voltage 12, 13 will not increase by more than a prescribed range of a few hundred millivolts, as discussed previously.

During the battery discharge test, the battery string voltage is monitored to determine the remaining reserve capacity of the batteries. The test duration is dependent upon the size of the battery and its reserve time design objective. When an algorithm within the microcontroller 38 determines that sufficient and consistent information has been collected to predict string capacity, the test is terminated. In applications with two or more battery strings, each string is tested separately, and then only after the previously tested string has completed its recharge and has been returned to its float charge mode. Many remote applications have battery strings comprised of multiple batteries (typically a 6 or 12 volt group of cells). Each battery is monitored during all modes to allow the identification of weaker batteries within a battery string.

At this time the voltage detector circuit will disable the gate drive signal to prevent the SCR 28 from conducting. This condition usually occurs during the boost charge mode of operation. A second voltage detector circuit (also part of the controller 26) monitors the system load bus 12 and restores the gate drive signal for the SCR 28 if the bus voltage falls below a second predetermined voltage threshold, herein termed "Threshold #2."

The shunting contactor set 30 is in parallel with the SCR 28 and connects the battery strings 14 to the system load bus 12 whenever the system load bus voltage falls below a predetermined threshold. As mentioned previously, the contactor set 30 has break-type (normally closed) contacts, thus connecting the battery strings 14 to the system load bus 12 if the contactor set 30 or its control fails. The contactor set 30 is operated (open) during float, boost, or test discharge modes.

Following a battery discharge, due to the load bus voltage being less than predetermined threshold (assuming the primary DC source is still inoperable or not keeping the load bus voltage at the desired magnitude), the contactor set 30 remains un-operated (closed), keeping the battery strings 14 attached to the system load bus 12.

The actions of each microcontroller 38 identified above in connection with FIG. 2 will now be described in more detail. Individually, for each item monitored, the control action of the microcontroller will be described.

System load bus voltage The microcontroller 38 monitors the system load bus voltage continuously and uses the data derived during emergency discharges to calculate remaining capacity during an emergency discharge.

Battery string voltage The microcontroller 38 monitors the battery string 14 voltage during the test discharge and uses the data derived to calculate the predicted capacity of the battery strings. It also uses this information to help determine the battery string health.

Battery cell 16 voltages or battery string 14 midpoints The microcontroller 38 monitors these data continuously and uses the information to help determine battery cell health.

Battery string current (each string) The microcontroller 38 monitors this information during battery recharge to determine when the contactor set 30 (relay) should be energized (opened). The float/boost regulator 36 is then used to finish charging the battery string 14.

System load current The system load current is monitored during discharge by the microcontroller 38. These data are used during an emergency discharge to calculate the remaining capacity of the system.

Temperature (near batteries) The ambient temperature in the near vicinity of the batteries is measured continuously and the information used to help calculate what temperature compensation might be needed to adjust a battery string or strings float current charge (i.e., to increase or decrease the float current).

Contactor set 30 The contactor 30 is a normally closed contactor. During the float/boost mode and the test discharge mode, contactor set 30 is energized (open), thus removing its direct connection across the SCR 28. When de-energized (closed), it shunts the SCR 28. The microcontroller 38 can program contactor set 30 either ON (open) or OFF (closed).

SCR 28 The function of the SCR 28 is to provide a voltage block of the system load bus voltage from the battery strings 14. Responsive to the microcontroller 38, the SCR 28 is "hard gated" when a loss of power is detected, thereby connecting the battery string 14 to the load bus 12, 13 until the contactor 30 closes.

One possible implementation of the system illustrated in FIGS. 1 and 2 constructed for use in a telephone switching plant, has the following specifications.

| | |
|---|---|
| Nominal primary DC source | −54 VDC |
| Nominal battery string voltage (float) | −54 VDC |
| Battery string voltage (open circuit) | −48 to −49 VDC |
| Number of battery strings | 4 |
| Battery string charging current (constant float) | 10–120 mA |
| Battery string charging current (constant boost) | 100–1200 mA |
| Test discharge current | 0–10 Amps |
| Voltage threshold #1 | −55 VDC |
| Voltage threshold #2 | −53 VDC |
| Rating of SCR 28 | Steady state current rated at approximately 1/3 of contactor set 30 rating (e.g., 16 Amps, which is approximately 1/3 of the 50 Amp contactor set 30 rating) |
| Normal SCR gate drive current | 1–10 mA |

Whereas the system of FIGS. 1 and 2 has been described in a VRLA battery application, the principles of the system may be employed with flooded lead acid batteries, Ni-Cad batteries,.and rechargeable batteries of other types.

Furthermore, it will be appreciated that various schemes for testing of the battery string 14 by the microcontroller 38 may be utilized. Examples include those described in U.S. Pat. No. 5,886,503. Those skilled in the art will also appreciate that, in order to ensure the battery string 14 is on line in the event of a failure of the rectifier 8, the microcontroller 38 should be adapted to sense voltage drops on the load bus 12, 13 and, when such an event is detected, to automatically terminate any discharge test currently underway.

Those skilled in the art will further appreciate that, the above embodiment has been described in the context of controlling battery cells or a group of cells to emphasize that the present system can be implemented to regulate a battery string on a cell-by-cell basis or in terms of groups of cells. Those skilled in the art will also appreciate that the present disclosed system can be used with any different type of rechargeable battery including, without limitation, Ni-Cad and VRLA batteries.

Finally, it will be appreciated that, although for ease of explanation, the present system has been described in connection with certain embodiments, there is no intention to limit the teachings of the invention thereto. Rather, it is intended that this patent cover all apparatuses and methods falling within the spirit and scope of the appended claims, either literally or under the doctrine of equivalents.

What is claimed is:

1. An apparatus for selectively charging and testing battery cells in one or more strings of battery cells electrically connected to one another within each string and employed as a back-up power supply for a primary power source, the one or more strings of battery cells selectively connectable to a load bus supplied by the primary power source in order to deliver power in the event of a failure of the primary power source, the apparatus comprising:

a main control module having a first power supply for supplying a charging power bus and a discharge bus; and one or more battery string modules each connected to a respective string of battery cells of the one or more strings of battery cells and to the load bus and configured to selectively electrically isolate the respective string of battery cells from the load bus, each of the one or more battery string modules having:

a regulator configured to receive charging power from the first power supply via the charging power bus, and supply and regulate charging power to the respective string of battery cells;

a controllable impedance;

a first controllable switch electrically connected in parallel with the controllable impedance, wherein the parallel combination of the controllable impedance and the first controllable switch is connected in series between the load bus and the corresponding string of battery cells; and a first controller configured to selectively control the controllable impedance and the first controllable switch, wherein the first controller detects when a voltage of the load bus is falling and subsequently initiates operation of the controllable impedance and the first controllable switch simultaneously, wherein the controllable impedance is operated for a predetermined time period.

2. An apparatus as defined in claim 1, wherein the predetermined time period is selected dependent on the closing time of the first controllable switch.

3. An apparatus as defined in claim 2, wherein the predetermined time period is less than 200 milliseconds.

4. An apparatus as defined in claim 1 wherein the controllable impedance is an SCR and the first controllable switch is a normally closed relay.

5. An apparatus as defined in claim 1 wherein each of the battery string modules is configured to selectively provide a float current to a corresponding string of battery cells.

6. An apparatus as defined in claim 5, wherein the float current delivered to the string of battery cells is regulated by the first controller through the regulator.

7. An apparatus as defined in claim 1, wherein the main control module further comprises a second controller that is configured to monitor and control levels of voltage and current output by first power supply on the charging power bus and at least control a voltage of the discharge bus.

8. An apparatus as defined in claim 7, wherein voltage delivered by the first power supply on the charging power bus is regulated by the second controller to a prescribed value based on a predetermined head room needed by the regulators in each of the battery string modules such that heat generated by the regulators is maintained at or below a desired heat generation level.

9. An apparatus as defined in claim 1 wherein each of the battery string modules further includes a second controllable switch that is controlled by the first controller and selectively electrically connects the corresponding battery string to the discharge bus during testing of the battery string.

10. An apparatus as defined in claim 9, wherein voltage output by the first power supply on the discharge bus is regulated by the second controller to a prescribed value such that a voltage of the main bus does not rise beyond a prescribed range when a loading of the main bus is reduced below a discharge test current limit and the battery string is connected to the discharge bus through the second controllable switch.

11. An apparatus as defined in claim 10, wherein the second controllable switch is a FET.

12. An apparatus as defined in claim 1, wherein the first controller is configured to effect charging of the battery string from the main power supply through the main bus through the first controllable switch until prescribed transition conditions occur.

13. An apparatus as defined in claim 12, wherein when the prescribed transition conditions occur, the first controller opens the first controllable switch and initiates boost charging of the battery string using the regulator to supply a boost current to the battery string.

14. An apparatus as defined in claim 13 wherein the regulation of the boost current delivered to the battery string is at least partially based on temperature.

15. An apparatus as defined in claim 12, wherein the prescribed transition conditions include the charging current of the battery string decreasing to a value, which is a prescribed fraction of a set boost current value, and a voltage level of the main bus greater than a loss of bus detection value.

16. An apparatus as defined in claim 15, wherein the prescribed fraction is approximately two-thirds.

17. An apparatus as defined in claim 1, wherein the first controller is configured to initiate operation of the controllable impedance and the first controllable switch when the first controller detects that a voltage level of the main bus falls below a predetermined loss of bus detection value.

18. An apparatus as defined in claim 1, wherein the first controller is configured to control the regulator to provide a float current to the battery string in order to maintain a predetermined level of charge in the battery string.

19. An apparatus as defined in claim 18 wherein the regulation of the float current delivered to the battery strings is at least partially based on temperature.

20. An apparatus as defined in claim 19, wherein the controller is configured to control the regulator to provide a float current to the battery string in order to maintain a predetermined level of charge in the battery string.

21. An apparatus as defined in claim 20 wherein the regulation of the float current delivered to the battery strings is at least partially based on temperature.

22. An apparatus for selectively charging and testing battery cells in a serial string of battery cells and employed as part of a back-up power supply to a primary power source that supplies power to a main bus connected to a load, the apparatus comprising:
    a regulator configured to receive charging power from an external power supply via a charging power bus, and supply and regulate charging power to the string of battery cells;
    a variable impedance;
    a first controllable switch electrically connected in parallel with the variable impedance, wherein the parallel combination of the variable impedance and the first controllable switch is connected in series between the load bus and the corresponding string of battery cells; and
    a controller configured to selectively control the variable impedance and the first controllable switch, wherein the controller is configured to detect when a voltage of the main bus is falling and subsequently initiate operation of the variable impedance and the first controllable switch simultaneously, wherein the variable impedance is operated for a predetermined time period.

23. An apparatus as defined in claim 22, wherein the predetermined time period is selected dependent on the closing time of the first controllable switch.

24. An apparatus as defined in claim 23, wherein the predetermined time period is less than 200 milliseconds.

25. An apparatus as defined in claim 22, wherein the variable impedance is an SCR and the first controllable switch is a normally closed relay.

26. An apparatus as defined in claim 22 wherein the regulator selectively provides a float current to the string of battery cells as determined by the controller.

27. An apparatus as defined in claim 26 wherein the float current delivered to the string of battery cells is regulated by the controller.

28. An apparatus as defined in claim 22 further comprising:
    a second controllable switch that is controlled by the controller and selectively electrically connects the battery string to a discharge bus during testing of the battery string.

29. An apparatus as defined in claim 28, wherein the second controllable switch is a FET.

30. An apparatus as defined in claims 22, wherein the controller is configured to effect charging of the battery string from the primary power source via the main bus through the first controllable switch until prescribed transition conditions occur.

31. An apparatus as defined in claim 30, wherein when the prescribed transition conditions occur, the controller opens the first controllable switch and initiates boost charging of the battery string using the regulator by supplying a boost current to the battery string.

32. An apparatus as defined in claim 31 wherein the regulation of the boost current delivered to the battery string is at least partially based on temperature.

33. An apparatus as defined in claim 30, wherein the prescribed transition conditions include the charging current of the battery string decreasing to a value that is a predetermined fraction of a boost current value and a voltage level of the main bus greater than a loss of bus detection value.

34. An apparatus as defined in claim 22, wherein the controller is configured to initiate operation of the variable impedance and the first controllable switch when the controller detects that a voltage level of the main bus falls below a predetermined loss of bus detection value.

35. A method for selectively charging and testing battery cells in one or more strings of battery cells electrically connected to one another within each string and employed as a back-up power supply for a primary power source, the one or more strings of battery cells selectively connectable to a load bus supplied by the primary power source in order to deliver power in the event of a failure of the primary power source, the method comprising:

providing a charging power and discharging voltage using a first power supply in a main control module; and selectively isolating the one or more strings of battery cells from the load bus using a combination of a controllable impedance and a first controllable switch both controlled by a first controller located within a corresponding battery string module connected to a respective string of battery cells of the one or more strings of battery cells;

selectively receiving charging power at each of the battery string modules from the first power supply via the charging power bus;

supplying and regulating charging power to the respective string of battery cells with each of the battery string modules;

detecting when a voltage of the load bus is falling using the first controller; and initiating operation of the controllable impedance and the first controllable switch simultaneously, wherein the controllable impedance is operated for a predetermined time period.

36. A method as defined in claim 35, wherein the predetermined time period is selected dependent on the closing time of the first controllable switch.

37. A method as defined in claim 36, wherein the predetermined time period is less than 200 milliseconds.

38. A method as defined in claim 35 wherein the controllable impedance is an SCR and the first controllable switch is a normally closed relay.

39. A method as defined in claim 35 further comprising:

selectively providing a float current to a corresponding string of battery cells within each of the battery string modules.

40. A method as defined in claim 39 wherein the float current delivered to the string of battery cells is regulated by control of the first controller.

41. A method as defined in claim 35, further comprising:

monitoring and selectively controlling levels of voltage and current of the charging power output by first power supply through the use of a second controller; and controlling the discharging voltage using the second controller.

42. A method as defined in claim 41, wherein the voltage of the charging power delivered by the first power supply is regulated by the second controller to a prescribed value based on a predetermined head room needed by regulators in each of the battery string modules such that heat generated by the regulators is maintained at or below a desired heat generation level.

43. A method as defined in claim 35 further comprising:

selectively connecting the one or more battery strings to the discharge voltage during testing of the corresponding battery string through a second controllable switch that is controlled by the first controller.

44. A method as defined in claim 43, wherein the discharge voltage is regulated by the second controller to a prescribed value such that a voltage of the main bus does not rise beyond a prescribed range when a loading of the main bus is reduced below a discharge test current limit and the battery string is connected to the discharge bus through the second controllable switch.

45. A method as defined in claim 43, wherein the second controllable switch is a FET.

46. A method as defined in claim 35, further comprising:

effecting charging of the one or more battery strings from the main power supply via the main bus through the respective first controllable switch under control of the corresponding first controller until prescribed transition conditions occur.

47. A method as defined in claim 46, wherein when the prescribed transition conditions occur, the first controller opens the first controllable switch and initiates boost charging of the battery string using a regulator withing the corresponding battery string module to supply a boost current to the battery string.

48. A method as defined in claim 47 wherein the regulation of the boost current delivered to the battery string is at least partially based on temperature.

49. A method as defined in claim 46, wherein the prescribed transition conditions include the charging current of the battery string decreasing to a value, which is a prescribed fraction of a set boost current value, and a voltage level of the main bus greater than a loss of bus detection value.

50. A method as defined in claim 49, wherein the prescribed fraction is approximately two-thirds.

51. A method as defined in claim 35, wherein the first controller is configured to initiate operation of the controllable impedance and the first controllable switch when the first controller detects that a voltage level of the main bus falls below a predetermined loss of bus detection value.

52. A method as defined in claim 35, wherein the first controller is configured controls the provision of a float current to the battery string in order to maintain a predetermined level of charge in the battery string.

53. A method as defined in claim 52, wherein the control of the float current delivered to the battery strings is at least partially based on temperature.

* * * * *

UNITED STATES PATENT AND TRADEMARK OFFICE
CERTIFICATE OF CORRECTION

PATENT NO. : 6,583,603 B1
DATED : June 24, 2003
INVENTOR(S) : Norman C. Baldwin

It is certified that error appears in the above-identified patent and that said Letters Patent is hereby corrected as shown below:

<u>Column 14,</u>
Line 52, after "as defined in," please delete "claims 22" and insert -- claim 22 -- in its place.

<u>Column 16,</u>
Line 33, after "using a regulator," please delete "withing" and insert -- within -- in its place.

Signed and Sealed this

Seventh Day of October, 2003

JAMES E. ROGAN
*Director of the United States Patent and Trademark Office*